United States Patent
Kang (10) Patent No.: US 8,723,101 B2
(45) Date of Patent: May 13, 2014

(54) INTEGRATED MOVEMENT SENSING KEY WITH A REFLECTION UNIT COMPRISING SEMICIRCLE MOTIFS

(75) Inventor: Ki Dong Kang, Seoul (KR)

(73) Assignee: Hyundai Motor Company, Seoul (KR)

( * ) Notice: Subject to any disclaimer, the term of this patent is extended or adjusted under 35 U.S.C. 154(b) by 587 days.

(21) Appl. No.: 12/533,399

(22) Filed: Jul. 31, 2009

(65) Prior Publication Data

US 2010/0096537 A1   Apr. 22, 2010

(30) Foreign Application Priority Data

Oct. 21, 2008 (KR) .................. 10-2008-0103294

(51) Int. Cl.
*G06M 7/00* (2006.01)
*H01J 5/02* (2006.01)

(52) U.S. Cl.
USPC ..................................... 250/221; 250/239

(58) Field of Classification Search
USPC ............... 250/239, 216, 221, 231.1, 231.13;
345/161, 165, 157, 156, 162, 163, 164,
345/168; 359/529, 530, 520, 521, 546;
340/540, 524, 555, 600, 686.1, 693.5;
356/604, 616, 617, 618, 619, 614, 620,
356/622, 615; 33/1 L, 1 M, 1 N, 1 PT;
341/13, 14
See application file for complete search history.

(56) References Cited

U.S. PATENT DOCUMENTS

| | | | | |
|---|---|---|---|---|
| 3,239,673 A | * | 3/1966 | Unruh | 250/231.12 |
| 5,943,233 A | * | 8/1999 | Ebina et al. | 700/85 |
| 6,121,955 A | * | 9/2000 | Liu | 345/161 |
| 6,232,959 B1 | * | 5/2001 | Pedersen | 345/161 |

FOREIGN PATENT DOCUMENTS

| | | | |
|---|---|---|---|
| GB | 2312685 A | * | 5/1997 |
| JP | 06-111695 A | | 4/1994 |
| JP | 08-287779 A | | 11/1996 |
| JP | 2000-299034 A | | 10/2000 |
| JP | 2003-068161 A | | 3/2003 |
| JP | 2006-323692 A | | 11/2006 |
| KR | 10-2006-0033525 A | | 4/2006 |
| KR | 10-0711139 B1 | | 4/2007 |

* cited by examiner

*Primary Examiner* — Que T Le
*Assistant Examiner* — Jennifer Bennett
(74) *Attorney, Agent, or Firm* — Edwards Wildman Palmer LLP; Peter F. Corless (57) ABSTRACT

The present invention relates to an integrated key using an optical key, in particular, to an integrated key which enables a more subdivided manipulation for the movement to the outside based on a center point, and to perform the operation of rotation and push. An integrated key using an optical sensor of the invention includes a housing which has an accommodation space inside while an upper portion is open; an operation member which has a guide unit which sticks to the housing between an upper end and a lower end of the operation member while a handle is formed in an upper side and a reflection unit is formed at a bottom surface; and an optical sensor which measures one or more of a separation distance with the reflection a rotation of the operation member, and a location coordinate value of the operation member, and outputs a sensing signal according to the measurement.

9 Claims, 8 Drawing Sheets

INTEGRATED MOVEMENT SENSING KEY WITH A REFLECTION UNIT COMPRISING SEMICIRCLE MOTIFS

CROSS-REFERENCE TO RELATED APPLICATION

This application claims under 35 U.S.C. §119(a) the benefit of Korean Patent Application No. 10-2008-0103294 filed on Oct. 21, 2009, the entire contents of which are incorporated herein by reference.

BACKGROUND OF THE INVENTION

The present invention relates to an integrated key which senses a rotation, a push, a movement toward the front, rear, right and left of a key.

Generally, an eight-direction button is a device which preferably includes a button for front, rear, right and left and four diagonal directions to manipulate moment in eight-directions. Preferably, the eight-direction button can manipulate movement only in eight-directions such as front, rear, right and left. However, recently, in navigation systems, and computer games, a more subdivided manipulation for further flexibility movement has become necessary in order to allow more control from the center point as well as eight-directions.

The above information disclosed in this the Background section is only for enhancement of understanding of the background of the invention and therefore it may contain information that does not form the prior art that is already known in this country to a person of ordinary skill in the art.

SUMMARY OF THE INVENTION

The present invention provides an integrated key which preferably allows a more subdivided manipulation of movement 2-dimensionally from a center point, and preferably performs a rotation and push operation.

According to preferred embodiments, the present invention features an integrated key using an optical sensor, where the integrated key preferably comprises a housing which has an accommodation space inside, while an upper portion is suitably open, an operation member which has a guide unit which preferably sticks to the housing between an upper end and a lower end of the operation member while a handle is preferably formed in an upper side and a reflection unit is preferably formed at a bottom surface; and an optical sensor, which preferably measures one or more of a separation distance with the reflection a rotation of the operation member, and a location coordinate value of the operation member, and suitably outputs a sensing signal according to the measurement In accordance with preferred embodiments of the present invention, an integrated key using an optical sensor further includes a supporting member which suitably enables up and down movement of the operation member while preferably wrapping the guide unit of the operation member.

In accordance with other certain preferred embodiments of the present invention, the supporting member suitably includes a main body which wraps the guide unit of the operation member; a groove which is preferably installed at the bottom surface of a main body suitably corresponding to the guide groove; an elastic body which is preferably inserted into the groove; and a body which is suitably supported by the elastic body in the guide groove which is able to move up and down.

In accordance with further preferred embodiments of the present invention, the guide unit preferably includes a plurality of grooves which are suitably formed at an outer circumference of the operation member; an elastic body which is preferably inserted in the plurality of grooves respectively; and a rotator which preferably moves the operation member to an outside direction from a center point according to contraction or tension of the elastic body and makes the operation member have various location coordinate values, or contacts with an inner circumference of the supporting member to rotate.

Preferably, in accordance with preferred embodiments of the present invention, the optical sensor includes a main body which has a panel shape; a distance and rotation sensor which is suitably installed at a central part of a main body, suitably senses an up and down movement of the operation member through a separation distance measurement with the operation member, and suitably senses a rotation of a reflector of the operation member; and a location detecting sensor which preferably is respectively installed in a girth of the main body, and calculates a movement distance and a movement direction through calculating a location coordinate value of the operation member by making use of the separation distance with the operation member, a separation distance between the rotation sensor and the operation member and a horizontal/vertical length of the main body.

In preferred embodiments, the integrated key using an optical sensor of the present invention suitably measures one or more separation distances with the reflection unit of an operation member, whether rotation, or a location coordinate value of the operation member, and then, suitably outputs a sensing signal according to the measurement. Accordingly, in further preferred embodiments, the integrated key described herein is capable of measuring a more subdivided movement direction of the operation member and the movement distance, thereby, allowing a suitably more precise manipulation of an electronic device such as a navigation device.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum).

As referred to herein, a hybrid vehicle is a vehicle that has two or more sources of power, for example both gasoline-powered and electric-powered.

The above features and advantages of the present invention will be apparent from or are set forth in more detail in the accompanying drawings, which are incorporated in and form a part of this specification, and the following Detailed Description, which together serve to explain by way of example the principles of the present invention.

BRIEF DESCRIPTION OF THE DRAWINGS

The above and other features of the present invention will now be described in detail with reference to certain exemplary embodiments thereof illustrated by the accompanying drawings which are given hereinafter by way of illustration only, and thus are not limitative of the present invention, and wherein.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

DETAILED DESCRIPTION OF THE EMBODIMENTS

As described herein, the present invention includes an integrated key using an optical sensor, the integrated key comprising a housing comprising an accommodation space, an operation member; and an optical sensor.

In one embodiment, the housing comprises an accommodation space inside, wherein the upper portion of the housing is open.

In another embodiment, the operation member has a guide unit.

In another further embodiment, the guide unit sticks to the housing between an upper end and a lower end of the operation member.

In still another further embodiment, a handle is formed in an upper side and a reflection unit is formed at a bottom surface of the operation member.

In another embodiment, the optical sensor measures one or more of a separation distance with the reflection a rotation of the operation member, and a location coordinate value of the operation member, and outputs a sensing signal according to the measurement.

In a further embodiment, the integrated key further comprises a supporting member.

In another embodiment, the supporting member comprises a main body, a groove, an elastic body, and an up and down movement body.

Hereinafter, exemplary embodiments of the present invention will be described in detail with reference to the attached drawings.

Figure 1:
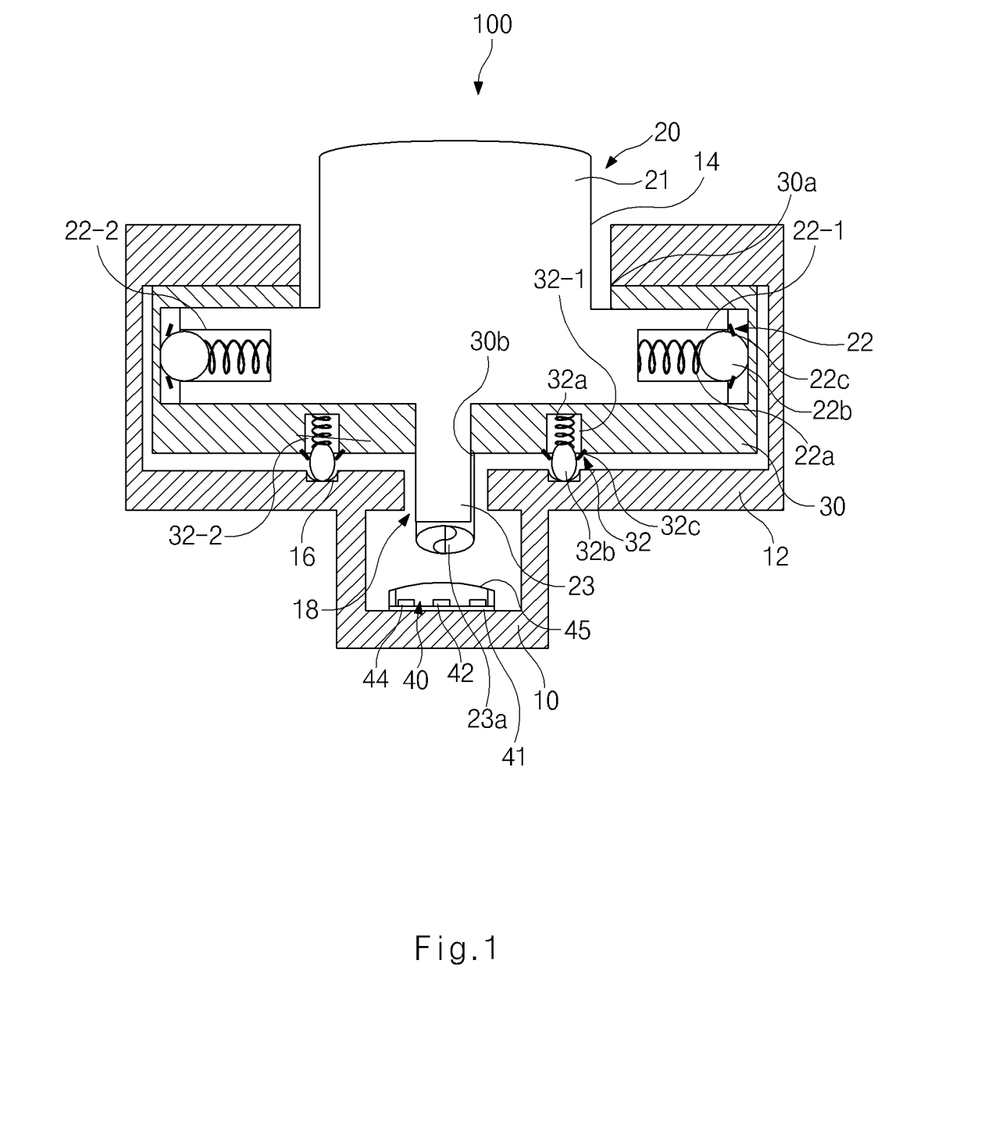
FIG. 1 is a front view of the present invention.

In one preferred embodiment, for example as shown in FIG. 1, a cross-sectional view of an integrated key 100 using an optical sensor of the present invention is shown.

According to certain embodiments, and as shown in FIG. 1, the integrated key 100 using an optical sensor of the present invention preferably includes a housing 10, an operation member 20, a supporting member 30 and an optical sensor 40.

In further preferred embodiments, the housing 10 has a rectangular shape. Preferably, an opening 14 is formed in the upper portion of the housing 10 while the side of the housing 10 and the floor side are preferably closed such that an accommodation space is suitably formed inside. According to certain preferred embodiments, in the accommodation space of the housing 10, a fixing unit 12 for supporting a supporting member 30 to which the operation member 20 is inserted is suitably formed.

According to certain preferred embodiments, a penetration hole 18 is suitably formed in the central part of a fixing unit 12 so that the lower portion of the operation member 20 may be able to pass. Preferably, the penetration hole 18 is suitably formed with a diameter corresponding to a range that does not exceed a location coordinate value (x, y) of the operation member 20 in the direction of front, rear, left and right so that the lower portion of the operation member 20 might be suitably positioned within a measurement area of the optical sensor 40 with respect to the location coordinate value (x, y) of the operation member 20.

According to further preferred embodiments, a guide groove 16 is suitably formed in the upper portion of the fixing unit 12 to which an up and down movement piece 32b that is suitably installed at the bottom surface of the supporting member 30 is inserted to guide the up and down movement of the up and down movement piece 32b.

In other further embodiments of the present invention, the operation member 20 preferably includes a handle 21, a reflection unit 23a and a guide unit 22. Preferably, the handle 21 is suitably formed in the upper portion of the operation member 20, being formed with a cylindrical shape such that a user can suitably grip the handle to perform the movement operation in a direction from the center to the outside, a rotation operation and a push motion.

According to other further embodiments, the reflection unit 23a is preferably formed in the bottom surface of the operation member 20 in such a manner that one or more semicircle motifs is suitably formed to be symmetrical in one side radius and the other side radius based on a center. Preferably, the semicircle motif is coated with a gray color. According to further related embodiments, the guide unit 22 is suitably extended to a circumferential direction from the center between the handle 21 and the reflection unit 23a.

Preferably, in the outer circumference of the guide unit 22, a plurality of grooves 22-1, 22-2 are suitably formed with numerous gaps while an elastic body 22a and a rotator 22b are prepared in the plurality of grooves 22-1, 22-2. Preferably, the rotator 22b is partly exposed to the outside of the groove and supported, by the support piece 22c installed at both sides of an inlet part of grooves 22-1, 22-2. The rotator 22b of the guide unit 22 preferably contacts the inner circumference of the supporting member 30.

In preferred embodiments, while the rotator 22b of the guide unit 22 rotates while in contact inner circumference of the supporting member 30, the operation member 20 is also preferably able to rotate. Preferably, while the rotator of the guide unit 22 rotates in the groove, the operation member 20 is suitably able to move from the center to the circumferential direction.

Preferably, the supporting member 30 includes a main body in which a first through-hole 30a and a second through-hole 30b are suitably formed in the upper portion and the lower portion respectively, and an accommodation space is prepared inside of the main body such that the main body preferably has the shape of a cylinder.

Accordingly, in preferred embodiments, the guide unit 22 of the operation member 20 is suitably inserted in the accommodation space of the main body of the supporting member 30. The handle 21 of the operation member 20 is exposed to the outside by the first through-hole 30a such that it is exposed to the upper of the housing 10. Preferably, the bottom of the operation member 20 is suitably exposed to the outside by the second through-hole such that it is inserted into the penetration hole 18 of the housing 10.

In further embodiments, at the bottom surface of the main body of the supporting member 30, a plurality of grooves 32-1, 32-2, an elastic body 32a inserted into the plurality of grooves 32-1, 32-2, the up and down movement piece 32b which moves up and down by the elastic body 32a and guided into the guide groove 16 of the housing 10, and a support piece 32c which prevents the up and down movement piece 32b from leaving the groove are prepared.

Preferably, the optical sensor 40 is suitably installed at the floor side of the housing 10 of the operation member 20, and separated from the reflection unit 23a with a preset distance. In certain preferred embodiments, the optical sensor 40 comprises the optical sensor of the ELMOS corp. Accordingly, the optical sensor 40 measures one or more of the separation distances with the reflection unit 23a of the operation member 20, whether rotation of the reflection unit 23a, or the location coordinate value of the operation member 20, and suitably outputs the sensing signal according to the measurement.

Figure 2:
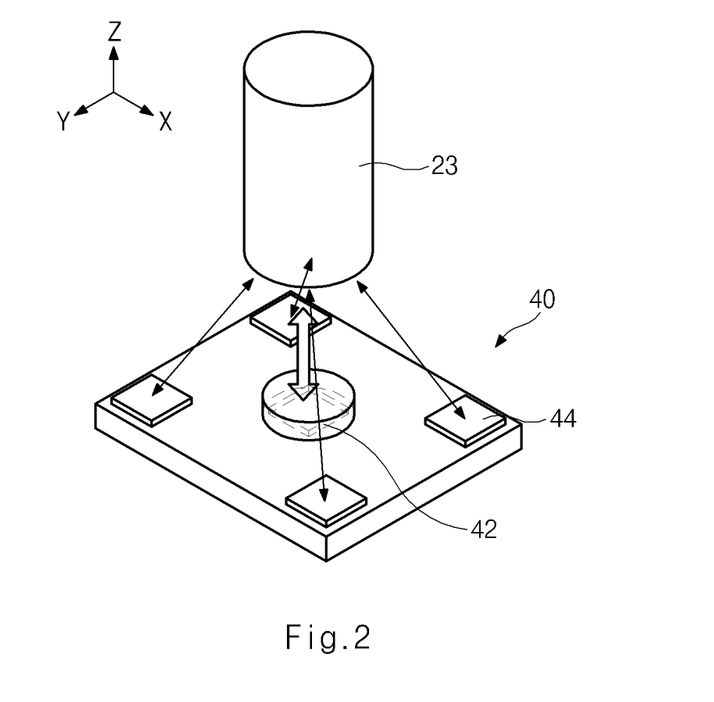
FIG. 2 is a perspective view of an optical sensor and the lower portion of an operation member of the present invention.

According to further preferred embodiments, for example as shown in FIG. 2, a perspective view of an optical sensor 40 and a lower portion of an operation member 20 of the present invention is shown.

Preferably, as shown in FIG. 2, the optical sensor 40 includes a main body 41, a distance and rotation sensor 42, and a location detecting sensor 44.

In further preferred embodiments, the main body 41 comprises of a panel suitably shaped like a square, supporting the distance measuring sensor and the location detecting sensor 44 prepared in the upper portion.

In further preferred embodiments, the distance and rotation sensor 42 is suitably installed at the central part of a main body 41 as a single unit. Preferably, such distance measuring sensor includes a light-emitting unit (not shown), a light-receiving unit (not shown) and a distance measuring unit (not shown), and a rotation sensing unit (not shown). In further embodiments, the light-emitting unit radiates light towards the reflection unit 23a of the lower portion of the operation member 20 over a preset period. Preferably, the light-receiving unit receives light which is suitably light-emitted by the light-emitting unit and suitably reflected by the reflection unit 23a.

Figure 3:
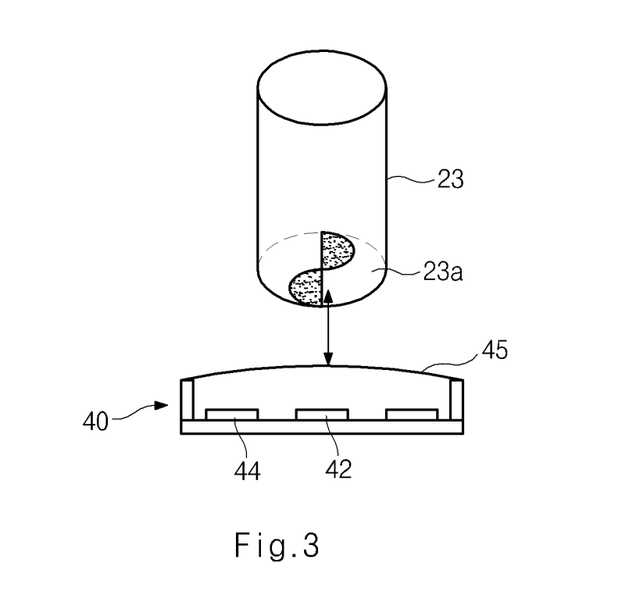
FIG. 3 is a side view showing the distance measuring unit of an optical sensor which measures distance between an optical sensor and the lower portion of an operation member.

In other further embodiments, for example as shown in FIG. 3, a side view showing a distance measuring unit of an optical sensor 40 which measures a distance between an optical sensor 40 and a lower portion of an operation member 20 is shown.

Referring to FIG. 3, the distance measuring unit preferably measures the distance between the optical sensor 40 and the lower portion of the operation member 20. Preferably, if the measured distance is within the preset distance, the distance measuring suitably determines that the operation member 20 performs a push motion, so that it suitably generates a sensing signal according to the push motion. In further embodiments, the rotation sensing unit analyzes the wave of light which is suitably received in the light-receiving unit and senses the rotation of the operation member 20. The method of analyzing the wave of the light and sensing whether the rotation of the operation member 20 by the rotation sensing unit will be illustrated in detail herein.

Figure 4A:
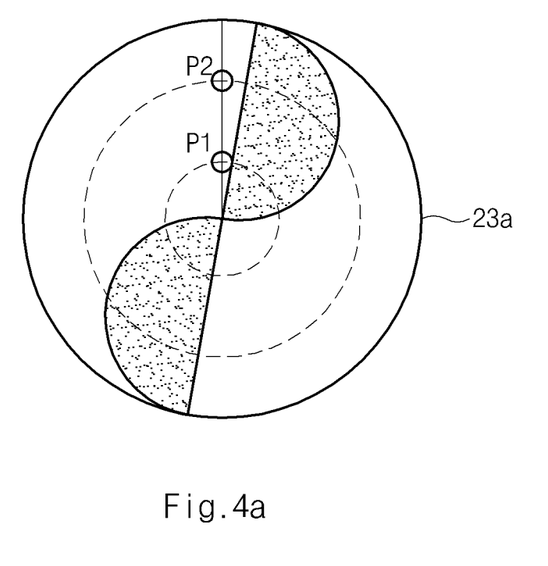
FIGS. 4a to 4d are front views of the reflection unit of an operation member of the present invention.
Figure 4B:
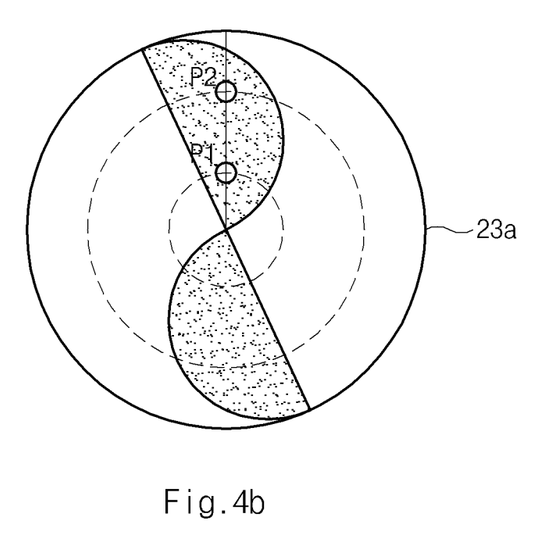
Figure 4C:
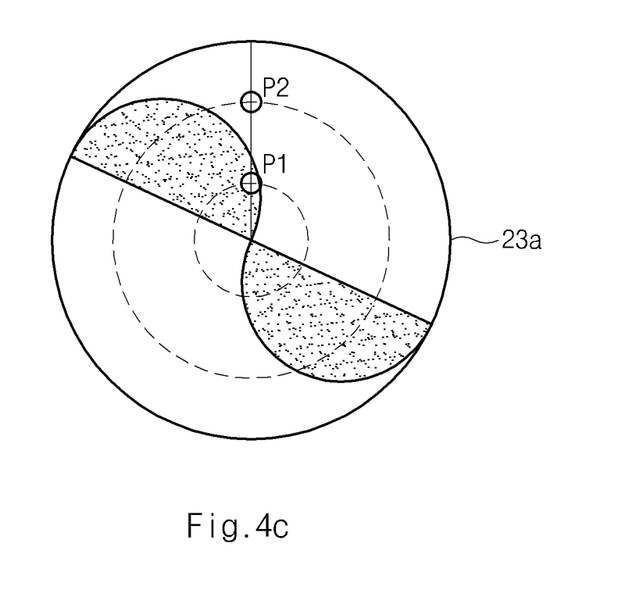
Figure 4D:
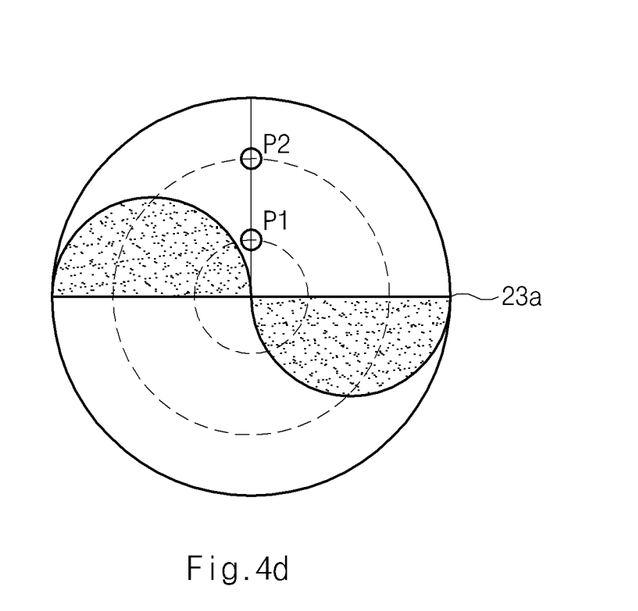
Figure 5:
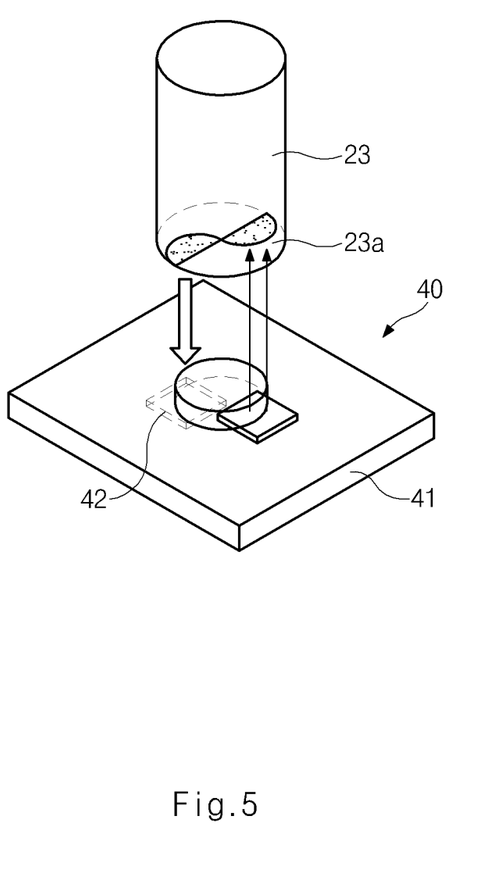
FIG. 5 is a side view of a rotation sensor of the present invention which senses a rotation of an operation member.

According to other further embodiments, and for example as shown in FIG. 4 and FIG. 5, FIGS. 4a to 4c are front views of a reflection unit 23a of a preferred operation member 20 of the present invention, and FIG. 5 is a side view of a rotation sensing unit of the present invention senses the rotation of the operation member 20.

Preferably, as shown in FIGS. 4a to 5, firstly, the reflection unit 23a is suitably formed in such a manner that one or more semicircle motifs is suitably formed to be symmetrical in one side radius and the other side radius. Accordingly, the light-emitting unit simultaneously radiates light having different frequencies to two points, that is, P1 and P2, on the same diameter.

Accordingly, in further preferred embodiments, in the case the reflection unit 23a is suitably positioned at a first location (state1, FIG. 4a), a half-moon motif does not exist toward P1 and P2. Accordingly, if a light is radiated to P1 and P2, the light received at the light-receiving unit is suitably analyzed as a waveform that both P1 and P2 does not contact with the half-moon motif. Further, in certain preferred embodiments, the reflection unit 23a is suitably positioned at a second location (state2, FIG. 4b), the half-moon motif exists in P1 and P2. Thus, if the light-emitting unit radiates light toward P1 and P2, the light received at the light-receiving unit is suitably analyzed as a waveform that both P1 and P2 contact with the half-moon motif.

According to other further embodiments, in certain preferred embodiments, the reflection unit 23a is suitably positioned at a third location (state3, FIG. 4c), the half-moon motif suitably exists in P1 whereas the half-moon motif does not exist in P2. Accordingly, if the light-emitting unit radiates light toward P1 and P2, the light P1 received at the light-receiving unit is suitably analyzed as a waveform that contacted the half-moon motif while P2 is suitably analyzed as a waveform which does not contact with the half-moon motif.

In further preferred embodiments of the present invention, the rotation sensing unit analyzes the waveform of light of P1 and P2 in a preset periodic interval and suitably determines that the operation member 20 rotates counterclockwise when the waveform of the operation unit preferably changes from state1→state2→state3→state1. Then, in further exemplary embodiments, the rotation sensing unit outputs a sensing signal according to the above operation. Preferably, the sensing signal is generated according to a suitably rotation angle which is preferably set according to the moment when state1 becomes state2, state3 and then state1. Accordingly, in further preferred embodiments, the number of the half-moon motif of the reflection unit 23a can suitably increase so that the rotation angle of the operation member 20 can be more accurately measured.

In further preferred embodiments of the present invention, the rotation sensing unit analyzes the waveform of P1 and P2 in a preset periodic interval and then suitably determines that the operation member 20 rotates clockwise when the waveform of the operation unit changes from state1→state3→state2→state1. Then, in further exemplary embodiments, the rotation sensing unit outputs a sensing signal according to the above operation. Preferably, the sensing signal is suitably generated according to a rotation angle which is suitably set according to the moment when the state1 becomes the state3, the state2 and the state1.

According to other preferred embodiments of the present invention, preferably, the location detecting sensor 44 includes four pairs of a light-emitting unit (not shown), a light-receiving unit (not shown) and a distance measuring unit (not shown) respectively installed in the girth of the main body 41, and one location calculation unit (not shown).

According to certain preferred embodiments, and referring for example to FIG. 2, the four light-emitting units radiate light which have different frequencies toward the reflection unit 23a of the lower portion of the operation member 20 in a preset periodic interval. According to further embodiments, the four light-receiving units preferably receive light which is light-emitted by the light-emitting unit and reflected by the reflection unit 23a. Preferably, in other related embodiments, the distance measuring unit suitably measures the distance between the optical sensor 40 and the lower portion of the operation member 20 through a reciprocating speed of light which is suitably radiated from the four light-emitting units respectively and received by the four light-receiving units respectively.

Figure 6:
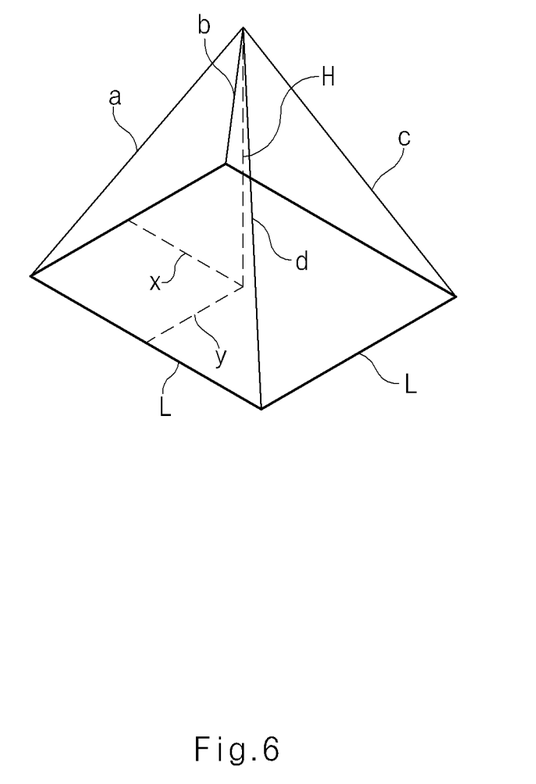
FIG. 6 is a configuration diagram of a location calculation unit of the present invention which calculates the location of an operation member.
Figure 7A:
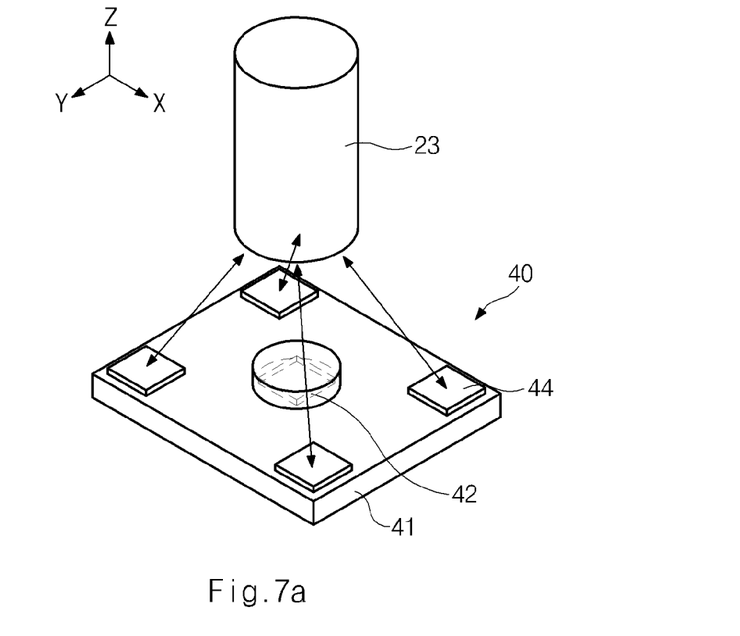
FIGS. 7a to 7d are perspective views of a location calculation unit of the present invention which calculates the location according to the various movement directions and movement distances of an operation member.
Figure 7B:
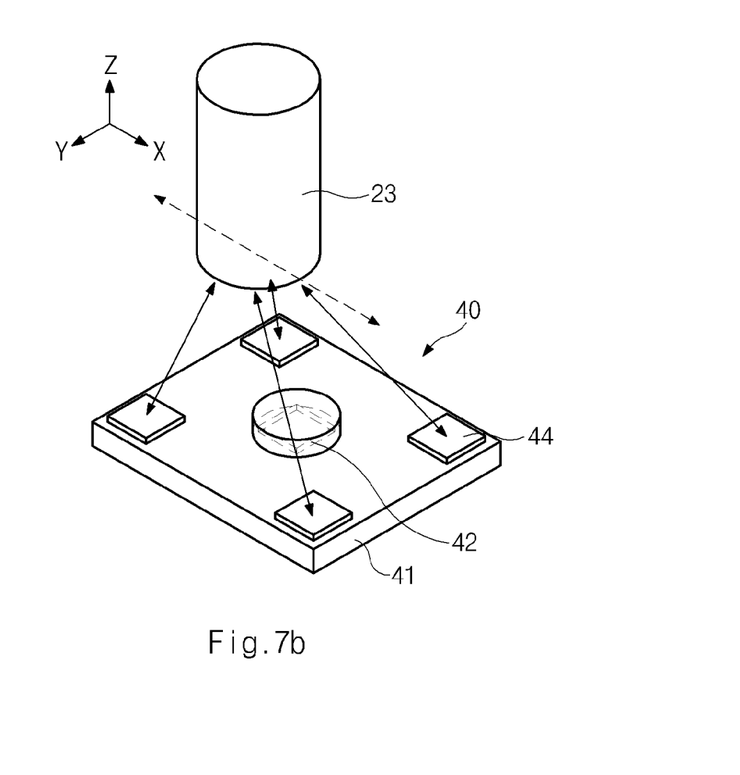
Figure 7C:
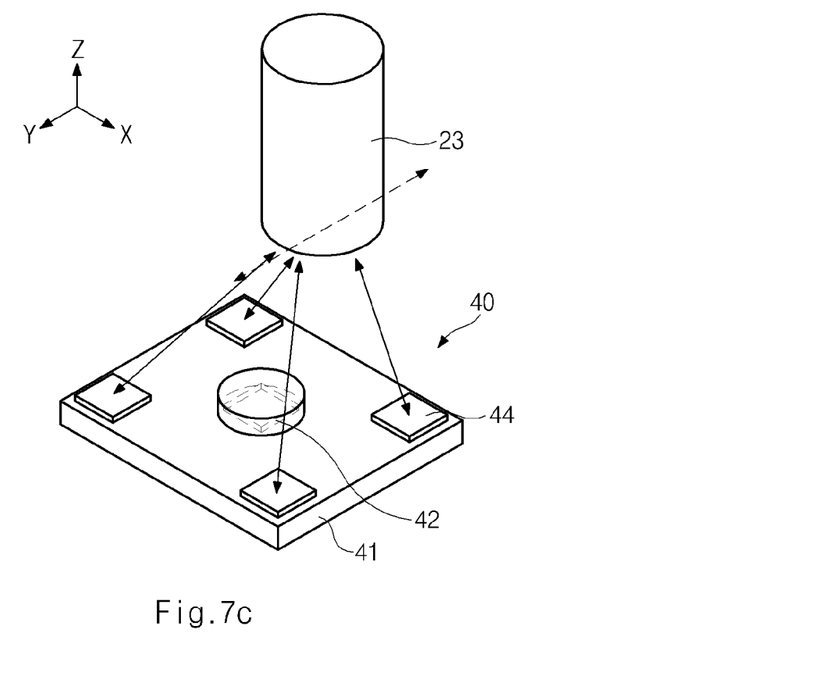
Figure 7D:
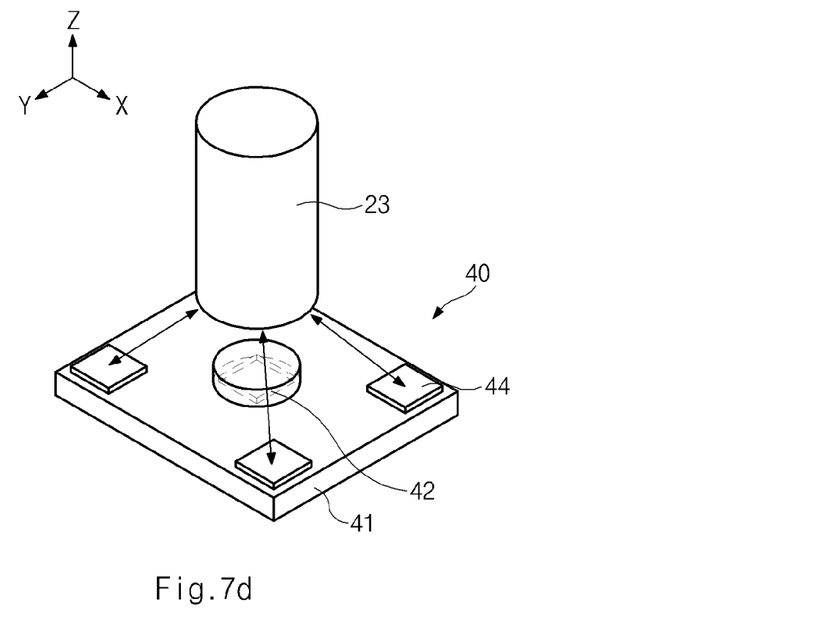

According to other further embodiments, and shown for example in FIG. 6, FIG. 6 is a configuration diagram of a location calculation unit of the present invention which suitably calculates the location of an operation member 20.

In certain exemplary embodiments, and referring for example to FIG. 6, the location calculation unit calculates a location coordinate value ⓧ, ⓨ of the operation member 20, preferably using Pythagoras' theorem by making use of the diagonal distance ⓐⓑⓒⓓ between each light-emitting unit and the lower portion of an operation member 20 delivered from the distance measuring unit of the four location detecting sensors 44, a separation distance ⓗ which is preset between the rotation sensing unit and the operation member 20, and a horizontal and vertical length ⓛ of the main body 41.

In certain exemplary embodiments, that is, $a^2=h^2+x^2+y^2$, $b^2=h^2+x^2+(L-y)^2$, $c^2=h^2+(L-x)^2+(L-y)^2$, $d^2=h^2+(L-x)^2+y^2$.

According to other exemplary embodiments, as shown for example in FIG. 7, FIGS. 7a to 7d are perspective views of a preferred location calculation unit of the present invention which suitably calculates the location according to the various movement directions and movement distance of an operation member 20.

For example, as shown in FIGS. 7a to 7d, the location calculation unit can suitably generate a sensing signal according to a location coordinate value ⓧ, ⓨ according to the various movement directions and movement distance of an operation member 20.

The operation of an integrated key 100 using an optical sensor according to preferred embodiments of the present invention is illustrated herein.

In another preferred embodiment of the invention, push motion is defined. In preferred exemplary embodiments, referring for example to FIG. 1 and 3, firstly, when the handle 21 of the operation member 20 is preferably pressed by a user, the up and down movement piece 32b installed at the bottom surface of a supporting member 30 suitably contracts the elastic body 32a while being moved to the groove 32-1, and the lower portion of an operation member 20 suitably approaches the distance and rotation sensor 42 of the optical sensor 40.

According to further related embodiments, the distance measuring unit of the distance and rotation sensor 42 preferably measures the distance between the optical sensor 40 and the lower portion of the operation member 20 through a reciprocating speed of light which is radiated from the light-emitting unit and reflected by the reflection unit 23a.

In further embodiments, if the measured distance is within a suitable preset distance, the distance measuring unit of the distance and rotation sensor 42 preferably determines that the operation member 20 performs a suitable push motion, so that it generates a sensing signal according to the suitable push motion. Preferably, if the handle 21 of the operation member 20 is suitably depressurized from a user, the up and down movement piece 32b installed at the bottom surface of the supporting member 30 returns to the original location due to tension of the elastic body 32a while moving the handle 21 of the operation member 20 to its original location.

In another preferred embodiment of the invention, rotating motion is defined. In preferred exemplary embodiments, referring for example to FIG. 1 and 5, firstly, when a pressurizing portion of the operation member 20 preferably receives a rotational force from a user, the operation member 20 suitably rotates along the inner circumference of the supporting member 30 inside of the accommodation space of the supporting member 30 by the guide unit 22 of the operation member 20.

Preferably, the rotation sensing unit of the distance and rotation sensor 42 analyzes the waveform a light from P1 and P2 which the light-receiving unit received in a preset periodic interval and suitably determines that the operation member 20 rotates counterclockwise when the waveform of the operation unit changes from state1→state2→state3→state1. According to related embodiments, the rotation sensing unit of the distance and rotation sensor 42 suitably generates a sensing signal according to a set movement angle by state according to a counterclockwise rotation at the moment when state1 becomes state2, state3 and then state1. Preferably, the number of the half-moon motif of the reflection unit 23a can be suitably increased so that the rotation angle of the operation member 20 can be more accurately measured.

In the meantime, the rotation sensing unit of the distance and rotation sensor 42 analyzes the waveform of P1 and P2 which the light-receiving unit received in a preset periodic interval. As a result of the analysis, the rotation sensing unit of the distance and rotation sensor 42 determines that the operation member 20 rotates clockwise when the waveform of the operation unit changes from state1→state3→state2→state1. Then, the rotation sensing unit of the distance and rotation sensor 42 generates a sensing signal according to a set movement angle by state according to a clockwise rotation at the moment when state1 becomes state3, state2 and then state1.

In another preferred embodiment of the invention, positioning is described. For example, in certain embodiments and referring for example to FIG. 2 and 6, firstly, the operation member 20 is suitably moved to a certain direction inside of the accommodation space of the supporting member 30, preferably with a certain distance by the guide unit 22 of the operation member 20, if a pressurizing portion of the operation member 20 moves to the particular direction by a user that is based in the center as the specific distance.

Preferably, the distance measuring unit of the location detecting sensor 44 suitably measures distance between the optical sensor 40 and the lower portion of the operation member 20 through a reciprocating speed of a light which is suitably radiated from the four light-emitting units respectively and suitably received by the four light-receiving units respectively.

Preferably, the location calculation unit of the distance and rotation sensor 42 suitably calculates a location coordinate value ⓧ, ⓨ of the operation member 20 using Pythagoras' theorem by making use of the diagonal distance ⓐⓑⓒⓓ between each light-emitting unit and the lower portion of the operation member 20 delivered from the distance measuring unit of the four location detecting sensors 44, a separation distance ⓗ which is suitably preset between the rotation sensing unit and the operation member 20 and a horizontal and vertical length ⓛ of the main body 41. In related embodiments, the location calculation unit preferably generates a sensing signal according to the location coordinate value ⓧ, ⓨ according to the movement direction and movement distance of the operation member 20.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An integrated key, the integrated key comprising:
   a housing which has an accommodation space inside that has an upper portion that is open;
   an operation member having a guide unit which sticks to the housing between an upper end and a lower end of the operation member while a handle is formed in an upper side and a reflection unit is formed at a bottom surface, wherein one or more semicircle motifs are each formed within a portion of diagonally opposing quadrants and intersecting at a circumference an axis of the reflection unit at least two points on the same axis; and
   an optical sensor configured to sense an up and down movement of the operation member through a separation distance measurement, sense rotation of the reflection unit of the operation member, determine a location coordinate value of the operation member, and output a sensing signal according to the measurement; and
   a supporting member enabling the up and down movement of the operation member while wrapping the guide unit of the operation member, wherein the operation member is configured to be moved freely a certain distance inside of an accommodation space of the supporting member in the vertical and horizontal directions based on a certain distance allowed by the guide unit.

2. The integrated key of claim 1, wherein the supporting member comprises:
   a main body which wraps the guide unit of the operation member;
   a groove which is installed at a bottom surface of the main body;
   an elastic body which is inserted into the groove; and
   an up and down movement body which is supported by the elastic body in the groove to be able to move up and down.

3. The integrated key of claim 2, wherein the guide unit comprises:
   a plurality of grooves which are formed at an outer circumference of the operation member;
   an elastic body which is inserted in the plurality of grooves respectively; and
   a rotator which moves the operation member to an outside direction from a center point according to contraction or tension of the elastic body and makes the operation member have various location coordinate values, or contacts with an inner circumference of the supporting member to rotate.

4. The integrated key of claim 1, wherein the optical sensor comprises:
   a main body which has a panel shape;
   a distance and rotation sensor which is installed at a central part of the main body, senses an up and down movement of the operation member through a separation distance measurement with the operation member, and senses a rotation of a reflector of the operation member; and
   a location detecting sensor which is respectively installed in a girth of the main body, and calculates a movement distance and a movement direction through calculating a location coordinate value of the operation member by making use of the separation distance with the operation member, a separation distance between the rotation sensor and the operation member and a horizontal/vertical length of the main body.

5. An integrated key, the integrated key comprising:
   a housing including an accommodation space;
   an operation member having a guide unit and a reflection unit is formed at a bottom surface wherein one or more semicircle motifs are formed symmetrically on both one side radius of the reflection unit and the other side radius of the reflection unit, wherein one or more semicircle motifs are each formed within a portion of diagonally opposing quadrants and intersecting at a circumference an axis of the reflection unit at least two points on the same axis; and
   an optical sensor configured to sense an up and down movement of the operation member through a separation distance measurement, sense rotation of the reflection unit of the operation member, determine a location coordinate value of the operation member, and output a sensing signal according to the measurement; and
   a supporting member, wherein the operation member is configured to be moved freely a certain distance inside of an accommodation space of the supporting member in the vertical and horizontal directions based on a certain distance allowed by the guide unit.

6. The integrated key of claim 5, wherein the housing comprises the accommodation space inside, and wherein the upper portion of the housing is open.

7. The integrated key of claim 5, wherein the guide unit sticks to the housing between an upper end and a lower end of the operation member.

8. The integrated key of claim 5, wherein a handle is formed in an upper side and the reflection unit is formed at the bottom surface of the operation member.

9. The integrated key of claim 5, wherein the optical sensor measures one or more of a separation distance with the reflection a rotation of the operation member, and a location coordinate value of the operation member, and outputs a sensing signal according to the measurement.

* * * * *